United States Patent
Yang et al.

(10) Patent No.: US 12,283,446 B2
(45) Date of Patent: Apr. 22, 2025

(54) SWITCH AND ELECTRONIC DEVICE INCLUDING THE SAME

(71) Applicant: SAMSUNG ELECTRONICS CO., LTD., Suwon-si (KR)

(72) Inventors: Dongil Yang, Suwon-si (KR); Taeyoung Kim, Suwon-si (KR); Hyoseok Na, Suwon-si (KR); Jonghyun Park, Suwon-si (KR); Doohwan Lee, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 236 days.

(21) Appl. No.: 18/077,882

(22) Filed: Dec. 8, 2022

(65) Prior Publication Data
US 2023/0136122 A1 May 4, 2023

Related U.S. Application Data

(63) Continuation of application No. PCT/KR2022/017012, filed on Nov. 2, 2022.

(30) Foreign Application Priority Data

Nov. 3, 2021 (KR) .................. 10-2021-0150113
Dec. 17, 2021 (KR) .................. 10-2021-0182000

(51) Int. Cl.
*H01H 9/54* (2006.01)
*H01H 9/02* (2006.01)
*H01H 59/00* (2006.01)

(52) U.S. Cl.
CPC ............ *H01H 9/54* (2013.01); *H01H 9/02* (2013.01); *H01H 59/0009* (2013.01); *B81B 2201/016* (2013.01)

(58) Field of Classification Search
CPC ............ H01H 1/0036; H01H 59/0009; H01H 2059/0027; H01H 9/54; B81B 2201/016
See application file for complete search history.

(56) References Cited

U.S. PATENT DOCUMENTS 6,307,452 B1   10/2001  Sun
7,145,213 B1   12/2006  Ebel et al.
(Continued)

FOREIGN PATENT DOCUMENTS

CN   102163516 A   8/2011
JP   2001143595 A   5/2001
(Continued)

OTHER PUBLICATIONS

International Search Report and Written Opinion for International Application No. PCT/KR2022/017012; International Filing Date Nov. 2, 2022; Date of Mailing Feb. 6, 2023; 52 Pages.

*Primary Examiner* — Jared Fureman
*Assistant Examiner* — Christopher J Clark
(74) *Attorney, Agent, or Firm* — CANTOR COLBURN LLP

(57) ABSTRACT

A switch in an electronic device includes a substrate, a first signal line, a second signal line, and a ground bridge. The first signal line is on the substrate and extends in a first direction. The second signal line is on the substrate and is spaced apart from the first signal line in a first direction parallel with the first signal line to branch the wireless communication signal at a first point and a second point of the first signal line. The ground bridge is at least partially movable in a space between the first signal line and the second signal line. A first capacitor is between a first point of the first signal line and one end of the second signal line, and a second capacitor is between a second point of the first signal line and the other end of the second signal line.

20 Claims, 12 Drawing Sheets

(56) References Cited

U.S. PATENT DOCUMENTS

| | | |
|---|---|---|
| 8,304,274 B2 | 11/2012 | Zuniga-Ortiz et al. |
| 10,855,073 B2 | 12/2020 | Fitzgerald et al. |
| 11,233,507 B2 | 1/2022 | Lukyanov et al. |
| 2003/0169146 A1 | 9/2003 | Kawai et al. |
| 2004/0124945 A1* | 7/2004 | Nakanishi .......... H01H 59/0009 333/105 |
| 2005/0248423 A1* | 11/2005 | Qian .................. H01H 59/0009 333/262 |
| 2006/0144681 A1 | 7/2006 | Lee et al. |
| 2007/0195464 A1 | 8/2007 | Kwon et al. |
| 2007/0228887 A1 | 10/2007 | Nishigaki et al. |
| 2010/0061024 A1 | 3/2010 | Premerlani et al. |
| 2019/0077655 A1* | 3/2019 | Akiyama ............. H01H 1/0036 |

FOREIGN PATENT DOCUMENTS

| | | |
|---|---|---|
| JP | 3818176 B2 | 9/2006 |
| JP | 2008160563 A | 7/2008 |
| KR | 100203056 B1 | 6/1999 |
| KR | 100943796 B1 | 2/2010 |
| KR | 101188438 B1 | 10/2012 |
| KR | 101647142 B1 | 8/2016 |
| WO | 2017145175 A2 | 8/2017 |

\* cited by examiner

[2002]

[2003]

[2004]

(3003)

(3004)

[4003]

[4004]

SWITCH AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/017012, filed on Nov. 2, 2022, which is based on and claims the benefit of a Korean patent application number 10-2021-0182000, filed on Dec. 17, 2021, in the Korean Intellectual Property Office, and of a Korean patent application number 10-2021-0150113, filed on Nov. 3, 2021, in the Korean Intellectual Property Office, the disclosure of each of which is incorporated by reference herein in its entirety.

TECHNICAL FIELD

Various embodiments relate to a radio frequency (RF) micro electro-mechanical system (MEMS) switch and an electronic device including the same.

BACKGROUND ART

MEMS technology is related to a technology field that processes micro switches, sensors, and/or precision mechanical parts using semiconductor processing technology.

Compared to active elements (e.g., pin diode, FET switch), MEMS switches provide various advantages including, but not limited to, wider usable frequency bands, excellent isolation characteristics (e.g., a characteristic that does not transfer or electrically conduct an RF signal when the switch is off), low insertion losses (e.g., a characteristic that transfers or electrically conducts an RF signal with a low loss when the switch is on), and excellent linearity.

As MEMS switches are increasingly used in selective transmission of RF signals or impedance matching circuits, interest in improving a performance of RF switches is increasing. In particular, capacitive RF switches have increasingly gained attention as an element suitable for high-frequency applications based on their capacitive characteristics.

DISCLOSURE

Technical Problem

An RF switch (e.g., capacitive shunt fixed-fixed beam type switch) may be turned on/off by a mechanical movement of a moving structure (e.g., membrane electrode). For example, a switch-on state is a state in which a signal line and a membrane electrode are spaced apart by a predetermined distance, and an RF signal may be transferred (e.g., electrically conducted) through a signal line. A switch-off state is a state in which the membrane electrode contacts the signal line due to a movement of the membrane electrode while a DC voltage (Vpi) is applied between the ground and the signal line, and the RF signal may be shunted.

However, although the RF switch does not apply a DC voltage (VPI) in a process of transmitting a high-power RF signal through the switch-on state (e.g., a turn on state of the switch), the transmission power (e.g., RF signal power) can produce a self-actuation which causes the membrane electrode to vibrate and shake inside the RF. The shaking and vibration produced by the self-actuation phenomenon may cause a change in capacitance in the membrane electrode and the signal line, thereby causing distortion of the RF transmission signal. Furthermore, there may occur a self-biasing phenomenon in which the signal is shunted as the membrane electrode contacts the signal line due to RF power in the switch-on state.

Technical Solution

Various embodiments described herein provide an RF MEMS switch having a new structure and an electronic device including the same for improving self-actuation and self-biasing generated inside the switch when the switch is on due to RF power. According to various embodiments, a switch included in an electronic device may include a substrate; a first signal line disposed on the substrate in a first direction to be connected to an input terminal and an output terminal of a wireless communication signal; a second signal line disposed on the substrate to be spaced apart from the first signal line in a first direction in parallel with the first signal line so as to branch the wireless communication signal at a first point L1 and a second point L2 of the first signal line; a ground bridge disposed to be at least partially movable in a space between the first signal line and the second signal line disposed on the substrate and connected to a ground; a first capacitor formed between the first point of the first signal line and one end of the second signal line; and a second capacitor formed between the second point of the first signal line and the other end of the second signal line.

According to various embodiments, an electronic device may include a communication module including at least one switch; and a processor, wherein the processor may be configured to control on/off of a wireless communication signal and a bias voltage through the at least one switch, wherein the at least one switch may include a substrate; a first signal line disposed on the substrate in a first direction to be connected to an input terminal and an output terminal of the wireless communication signal; a second signal line disposed on the substrate to be spaced apart from the first signal line in a first direction in parallel with the first signal line so as to branch the wireless communication signal at a first point L1 and a second point L2 of the first signal line; a ground bridge disposed to be at least partially movable in a space between the first signal line and the second signal line disposed on the substrate and connected to a ground; a first capacitor formed between the first point of the first signal line and one end of the second signal line; and a second capacitor formed between the second point of the first signal line and the other end of the second signal line.

Advantageous Effects

According to various embodiments, an RF switch branches an RF signal so that a symmetrical electric force is applied to a signal line of the RF signal around a moving structure (e.g., ground bridge) that controls the switch on/off operation, thereby reducing, or even completely preventing, shaking of the moving structure that can occur due to RF transmission power inside the switch. Accordingly, limitations of transmission power found in RF switches can be improved.

MODE FOR DISCLOSURE

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

Figure 1:
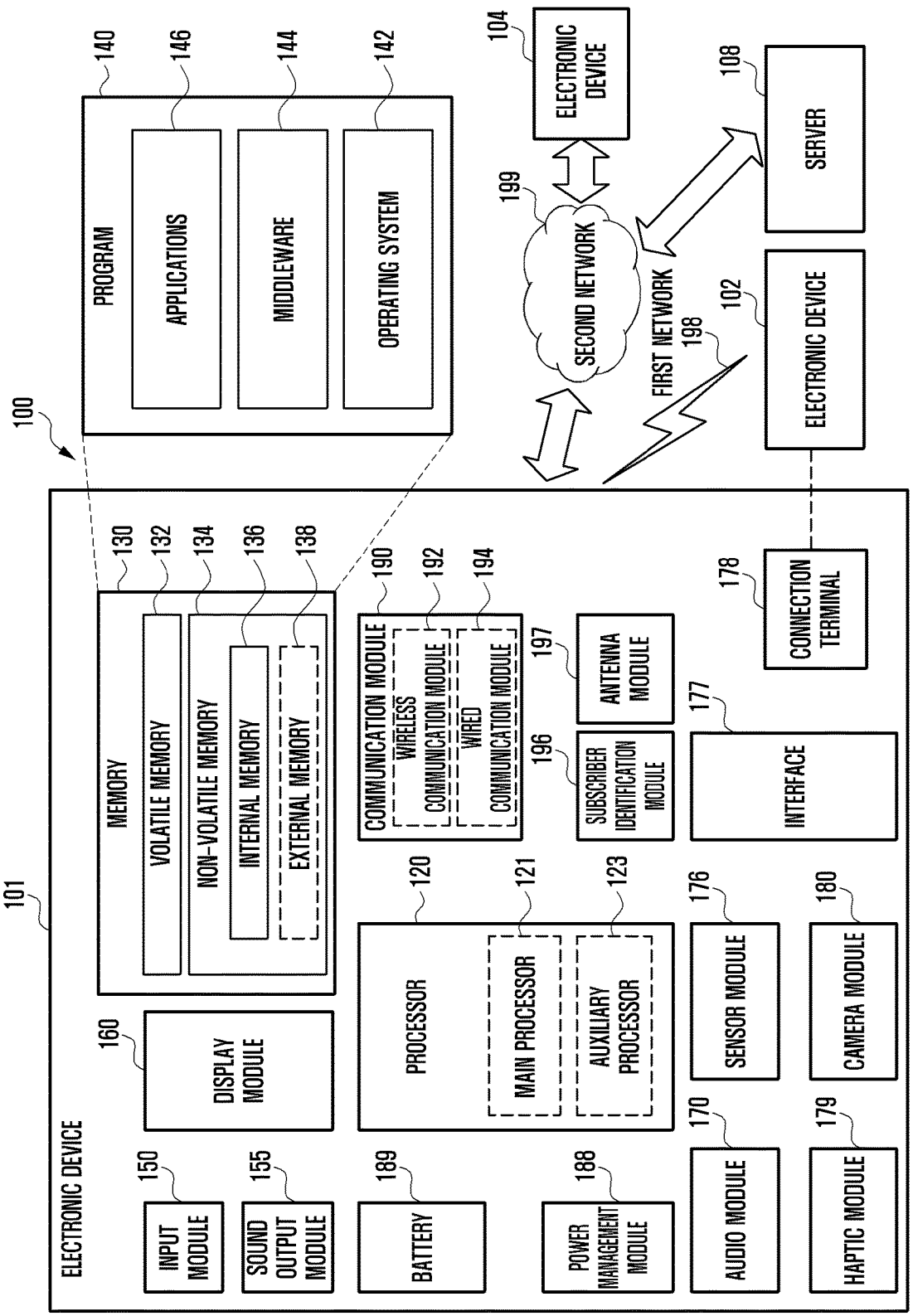
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
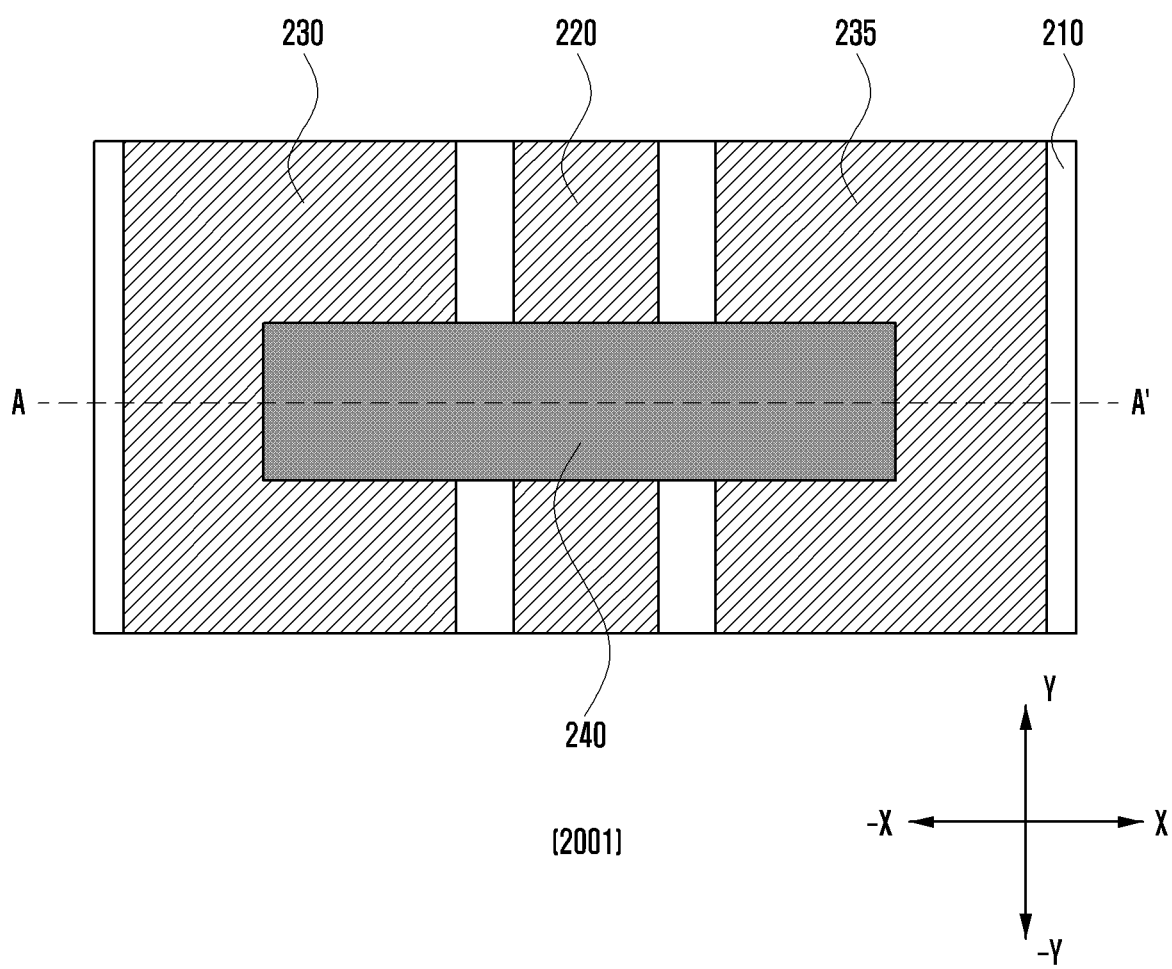
FIGS. 2A to 2C illustrate a general RF switch structure.
Figure 2B:
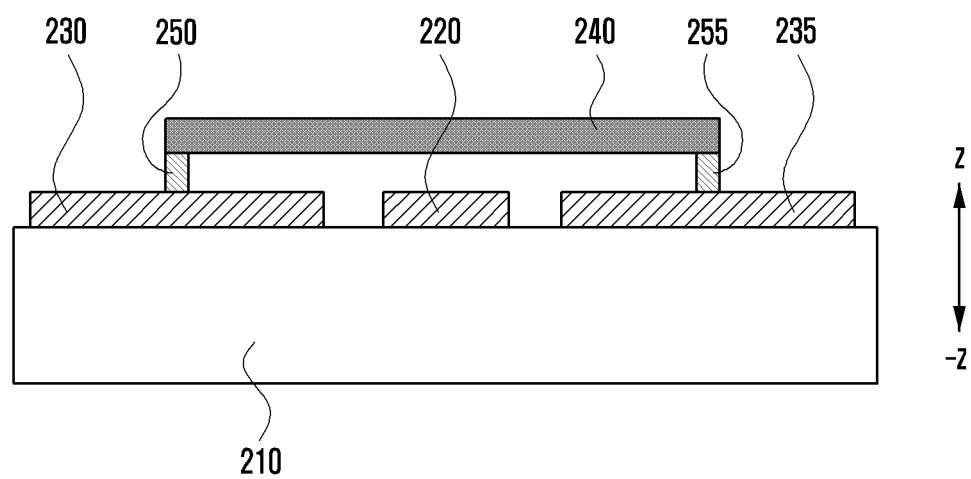
Figure 2B:
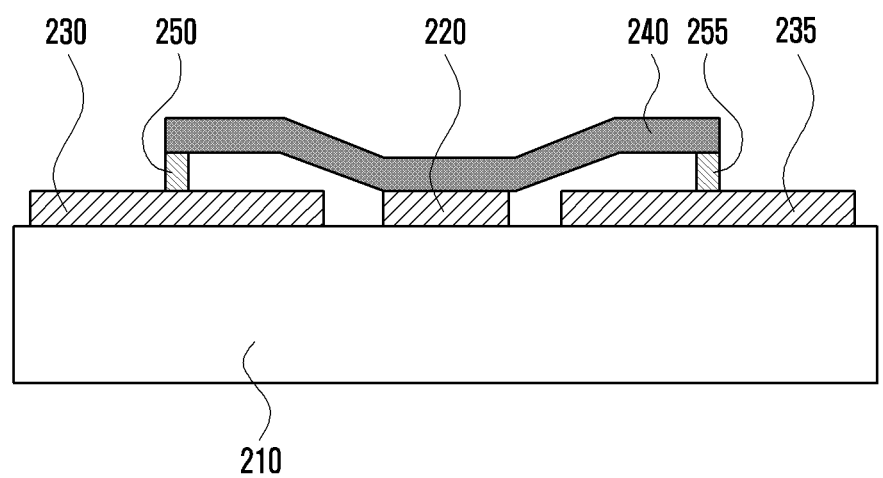
Figure 2C:
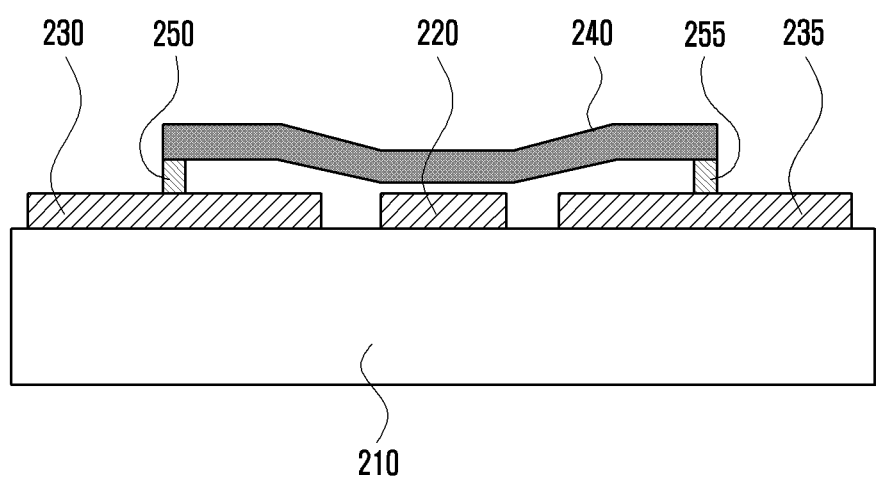

FIGS. 2A to 2C illustrate a general RF switch structure. Here, FIG. 2A is a plan view of an RF switch, and FIG. 2B is a cross-sectional view taken along line A-A' of FIG. 2A.

As illustrated in <2001>, in a structure of a general (or conventional) RF switch, a signal line 220 may be disposed on a substrate 210, and at each of both sides (e.g., y-axis direction) of the signal line 220 in a longitudinal direction, a first ground 230 and a second ground 235 spaced apart from each other may be disposed.

A membrane electrode (or vibrating member) 240 may be disposed on the first ground 230 and the second ground 235 in a vertical direction (e.g., x-axis direction) crossing the signal line 220.

The membrane electrode 240 may be supported by a first support member 250 and a second support member 255 to be spaced apart by a predetermined distance in a direction (e.g., z-axis direction) of an upper surface of the signal line 220.

In case that the switch is on, as illustrated in <2002>, a voltage is not applied between the signal line 220 and the ground (e.g., at least one of the first ground 230 or the second ground 235), and the signal line 220 and the membrane electrode 240 may be spaced apart from each other by a predetermined distance. In the switch-on state, because the capacitance between the signal line 220 and the membrane electrode 240 is small and does not affect the impedance of the signal line 220, the RF signal may be transferred along the signal line 220 from an input terminal (RF in) to an output terminal (RF out).

In case that the switch is off, as illustrated in <2003>, a specific voltage (e.g., bias voltage) is applied between the signal line 220 and the ground (e.g., at least one of the first ground 230 or the second ground 235), and the signal line 220 and the membrane electrode 240 are attracted to each other by an electrostatic force between the membrane electrode 240 and the signal line 220. In this case, the membrane electrode 240 is bent due to the generated attractive force and is in contact with the signal line 220, and the RF signal applied to the signal line 220 may be transferred to the ground (e.g., the first ground 230 and to the second ground 235) through the membrane electrode 240.

When a specific voltage applied to the signal line 220 and the ground (e.g., at least one of the first ground 230 or the second ground 235) is stopped, the RF switch returns to the switch ON state, and the RF signal flows along the signal line 220.

However, when the RF switch of the above structure is used in a high-power transmitter (e.g., RF antenna newer, RF module), there may be a limit in the magnitude of transferred power. For example, upon transferring a high-power RF signal, even though no voltage is applied to the signal line 220 and the ground (e.g., at least one of the first ground 230 or the second ground 235), as illustrated in <2004>, self-actuation in which the membrane electrode 240 shakes itself due to transmission power (e.g., RF signal power) may occur inside the RF switch. Self-actuation causes distortion of the RF transmission signal due to a change in capacitance of the signal line 220, and as the RF power increases, a self-biasing problem may arise which causes the membrane electrode 240 to move away from the signal line 220 and shunt the signal.

Various embodiments of the present disclosure propose a switch having a new and novel structure that avoids undesirable shaking of the switch membrane 240 and improves the power limit of an RF signal.

Figure 3A:
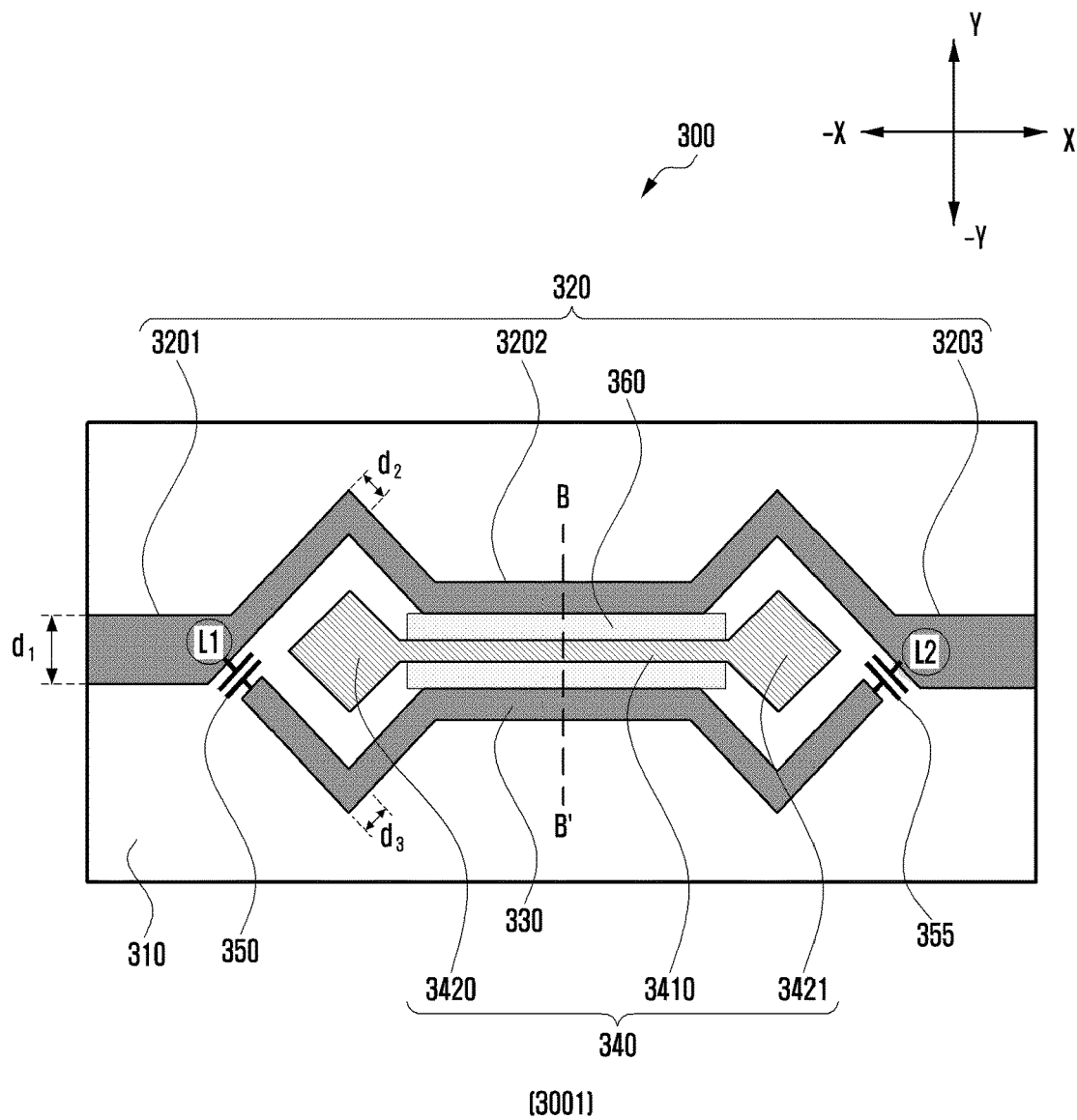
FIG. 3A illustrates a structure of an improved switch according to various embodiments.
Figure 3A:
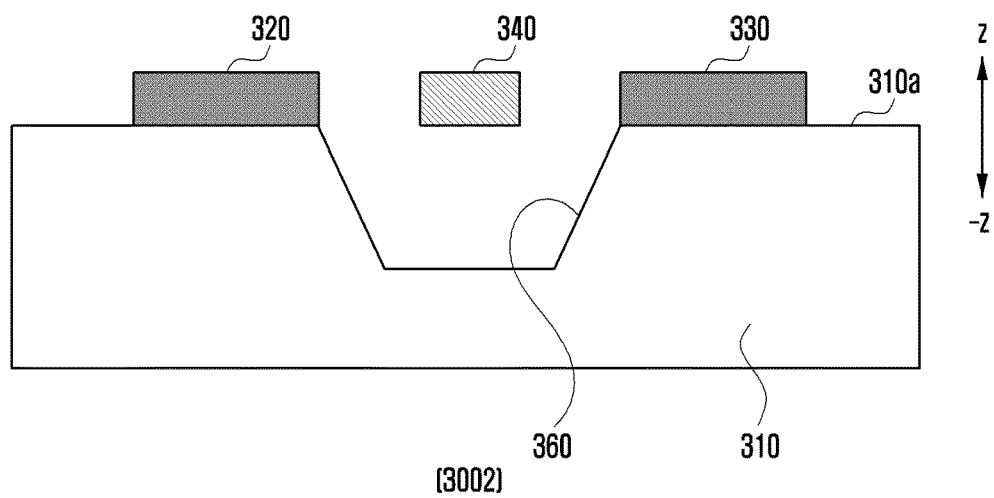

FIG. 3A illustrates a structure of an improved switch according to various embodiments.

Here, <3001> is a plan view illustrating a first surface (e.g., upper surface) of the switch, and <3002> is a cross-sectional view taken along line B-B' of 3001.

With reference to FIG. 3A, a switch 300 (e.g., radio frequency (RF) switch) of a proposed structure according to various embodiments may include a substrate 310, a first signal line 320, a second signal line 330, a ground bridge 340, a first capacitor 350, and a second capacitor 355. At least one switch 300 of a structure illustrated in FIG. 3A may be included in the components of FIG. 1 (e.g., the communication module and the antenna module of FIG. 1).

The substrate 310 may be, for example, a printed circuit board (PCB) or a flexible printed circuit board (FPCB). The PCB or the FPCB may be made of, for example, a material that may be used in a semiconductor process, such as a high-resistance silicon wafer, glass, quartz, or $SiO_2$, Si, and GaAs advantageous for RF characteristics.

According to an embodiment, at least one of components, for example, a processor, a memory, and a communication module of the electronic device 101 may be disposed in the substrate 310. According to an embodiment, at least one switch 300 may be included in a path of an external wiring or an internal wiring between components mounted on the substrate 310.

The substrate 310, includes a first signal line 320, a second signal line 330, and a ground bridge 340. The first signal line 320 and the second signal line 330 may be disposed on a first surface (e.g., an upper surface) of the substrate 310. The first signal line 320 has a predetermined length in a first direction (e.g., x-axis direction) as a transmission line of a radio frequency (RF) signal. The second signal line 330 is spaced apart from the first signal line 320 such that the first and second signal lines 320 and 330 may be disposed side by side in a first direction. The ground bridge 340 may be disposed in a space between the first signal line 320 and the second signal line 330. The first signal line 320, the ground bridge 340, and the second signal line 330 may be spaced apart from each other in a second direction (e.g., y-axis direction).

The first signal line 320 and the second signal line 330 may branch the RF signal, with the ground bridge 340 interposed therebetween to transfer the RF signal applied from one side to the other side. For example, an RF signal transferred to the input terminal (e.g., RF in) through the communication module electrically connected to the substrate 310 may be transferred to an antenna (e.g., an RF out) through the first signal line 320 and the second signal line 330, and conversely, an RF signal received through the antenna (e.g., RF in) may be transferred to the communication module (e.g., RF out).

According to an embodiment, the ground bridge 340 may at least be partially movably disposed in a space between the first signal line 320 and the second signal line 330 disposed on the substrate 310.

According to an embodiment, a groove (or trench) 360 may be formed in the substrate 310 and may extend in a third direction (e.g., −z direction) that is lower by a first depth than the first surface (e.g., upper surface) 310a. The groove 360 may be formed to secure a space in which at least a portion of the ground bridge 340 may move (or vibrate). The groove 360 may be formed, for example, by bulk micromachine technology (e.g., a combination of semiconductor integrated circuit technology and micro-machine technology), but is not limited thereto, and may be removed by one method of dry etching and wet etching.

According to an embodiment, the ground bridge 340 may include a metal made of at least one of a conductive material, for example, a metal material such as Au, Cu, Al, Cr, Ni, Mo, W, Pt, Ru, Rh, Ta, Ti, TiN, or Ag or an alloy including any one of them. For example, the ground bridge 340 may have elasticity to move on the substrate, and be made of a material having a restoring force when a DC voltage (e.g., bias voltage) is removed.

According to an embodiment, the ground bridge 340 may be disposed to cross the groove 360 formed on the substrate 310 in the first direction (e.g., x-axis direction).

For example, the ground bridge 340 may include at least partially movable vibrating part (e.g., actuating part) 3410 and a first fixing part 3420 and second fixing part 3421 (e.g., fixed pad, fixed part) extended in both directions from the vibrating part 3401 and for supporting the vibrating part 3410 on the substrate 310. The first fixing part 3420 and the second fixing part 3421 may perform a role of supporting the vibrating part 3410 disposed on the groove 360 and transferring a voltage applied through a feeding line (not illustrated) to the vibrating part 3410. Because the vibrating part 3410 is floating on the groove 360 formed in the substrate 310, when a DC voltage is applied, the vibrating part 3410 may move by an electrostatic force generated between the vibrating part 3410 and the first signal line 320. According to an embodiment, the first fixing part 3420 and the second fixing part 3421 may be electrically connected to a ground (not illustrated).

The first fixing part 3420 and the second fixing part 3421 may be designed in a pattern illustrated in FIG. 3A, but are not limited thereto, and may be designed in various patterns such as a square or a circle.

According to an embodiment, patterns of the first signal line 320 and the second signal line 330 may be designed so that a symmetrical electric force is applied in both directions side by side around the ground bridge 340 corresponding to the pattern of the ground bridge 340.

For example, the first signal line 320 and the second signal line 330 may be formed in a pattern symmetrical to each other with the ground bridge 340 having a predetermined length in the first direction interposed therebetween. A distance between the ground bridge 340 and the first signal line 320 may be designed to be substantially the same as a distance between the ground bridge 340 and the second signal line 330.

According to an embodiment, the first signal line 320 may have a first length in a first direction, and the second signal line 330 may have a second length shorter than the first length.

According to an embodiment, the first signal line 320 may include a first area 3201 (e.g., input/output line) having a first width d1, a second area 3202 (e.g., signal branch line) extended from one direction (e.g., x-axis direction, direction ①) of the first area 3201 and having a second width d2 narrower than the first width d1, or a third area 3203 (e.g., input/output line) extended from the second area 3202 and having the first width d1.

According to an embodiment, one of the first area 3201 and the third area 3203 of the first signal line 320 may be connected to the RF input terminal (RF in), and the other one thereof may be connected to the RF output terminal (RF out). For example, when the first area 3201 of the first signal line 320 is electrically connected to a signal source (e.g., processor) providing an RF signal, the third area 3203 may be electrically connected to a component (e.g., antenna) that outputs an RF signal. The RF signal may be transferred from the RF input terminal (RF in) to the RF output terminal (RF out), but is not limited thereto, and may be designed to be transferred from the RF output terminal to the RF input terminal.

According to an embodiment, the second signal line 330 may be designed with a third width d3. The third width d3 of the second signal line 330 may be designed to match the same impedance as that of the second width d2 of the first signal line 320 for branching the RF signal.

According to an embodiment, the first signal line 320 and the second signal line 330 may include a metal made of at least any one of metal materials such as Au, Cu, Al, Cr, Ni, Mo, W, Pt, Ru, Rh, Ta, Ti, TiN, or Ag, or an alloy including any one of them. The first signal line 320 and the second signal line 330 may be formed using at least one of battery electroplating, electroless plating, sputtering, or chemical vapor deposition (CVD).

According to an embodiment, the first signal line 320 may be configured to couple to one end of the second signal line 330 so as to branch the RF signal at a first point L1, and be configured to couple to the other end of the second signal line 330 at a second point L2. For example, the first capacitor 350 may be disposed between the first point L1 of the first signal line 320 and one end of the second signal line 330, and a second capacitor 355 may be disposed between the second point L2 of the first signal line 320 and the other end of the second signal line 330

Figure 3B:
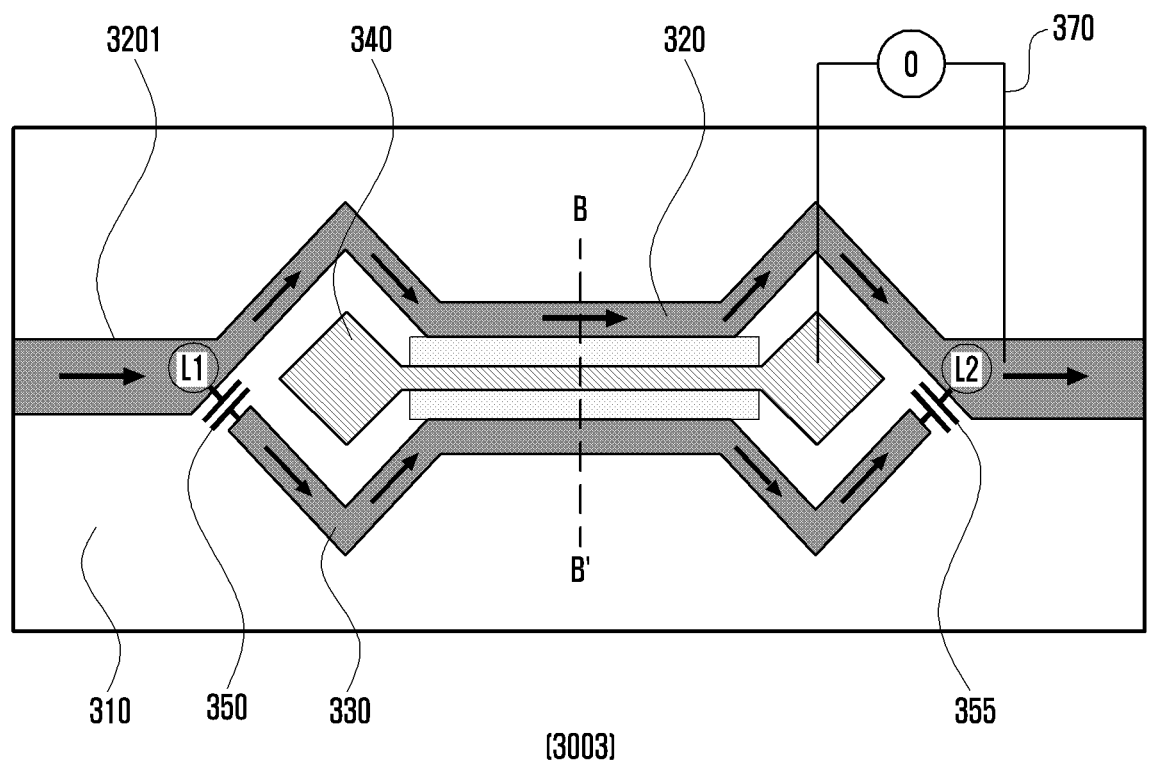
FIGS. 3B and 3C are diagrams illustrating an on/off operation of an improved switch according to various embodiments.
Figure 3B:
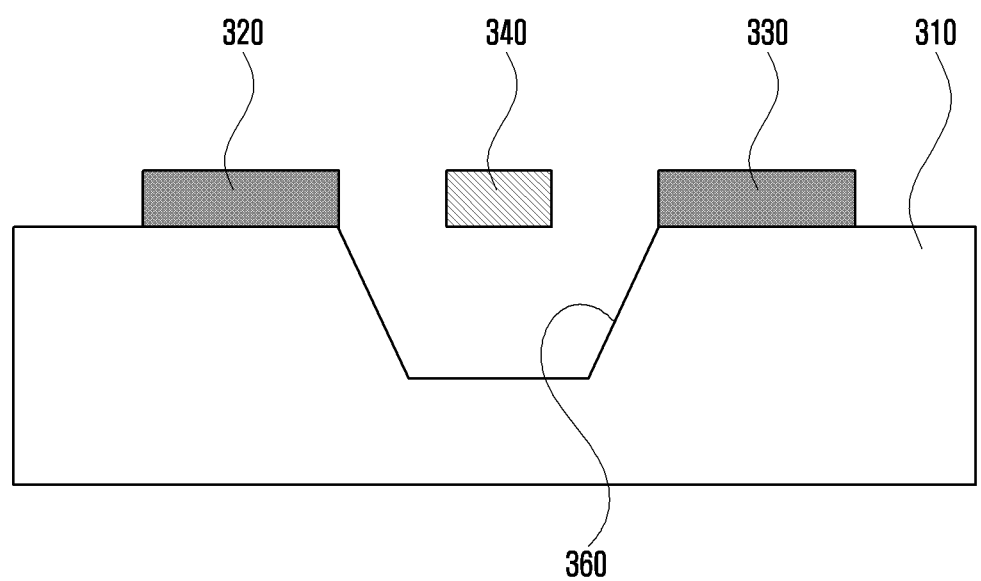
Figure 3C:
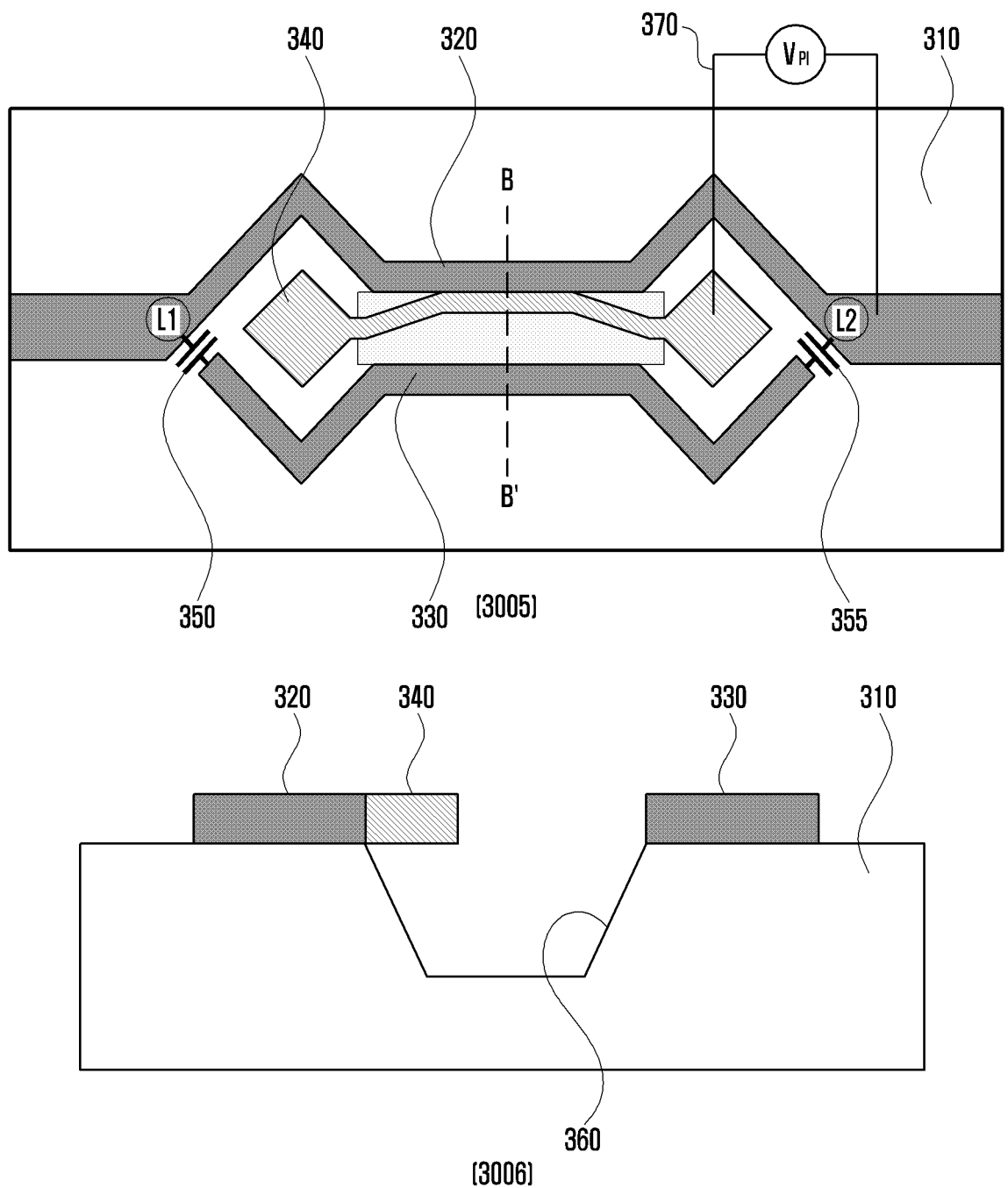

FIGS. 3B and 3C are diagrams illustrating an on/off operation of an improved switch according to various embodiments. Here, FIG. 3B illustrates a structure during a switch-on operation, and FIG. 3C illustrates a structure during a switch-off operation.

According to an embodiment, at least a portion of the first signal line 320 and the ground bridge 340 (e.g., at least one fixing part 3410 of the first fixing part or the second fixing part) may be connected to a feeding line 370 for applying a bias voltage. The feeding line 370 may be connected to the processor (e.g., communication processor) of the electronic device 101 (e.g., the processor 120 of FIG. 1). The processor 120 may control on/off of the switch 300 (e.g., radio frequency (RF) switch) according to a transmission or reception signal of an RF signal.

According to an embodiment, the processor 120 may apply a DC voltage (e.g., bias voltage) to the first signal line 320 and the ground bridge 340 through the feeding line 370 to turn off the RF switch 300 and shunt the DC voltage to turn on the RF switch 300.

When the switch-on operation is described, if a DC voltage (or bias voltage) is not applied to the ground bridge 340 and the first signal line 320, the switch 300 may be turned on to transfer the RF signal from one side to the other side.

According to an embodiment, the RF signal transferred through the RF in (e.g., the RF input terminal) may be branched at the first point L1, and be merged at the second point L2 to be transferred to the RF out (e.g., the RF output terminal). For example, as illustrated in <3003>, in case that the RF signal input to the first area 3201 of the first signal line 320 through the RF input terminal is transferred to the first power, the RF signal may be transferred with second power from the first point L1 to each of the second area 3202 of the first signal line 320 and the second signal line 330.

According to an embodiment, the first capacitor 350 and the second capacitor 355 may be designed to have substantially the same impedance value as an impedance value in which the RF signal transferred to the second area 3202 of the first signal line 320 is transferred. Because the first capacitor 350 and the second capacitor 355 shunt a DC signal, the first capacitor 350 and the second capacitor 355 may less affect a transmission performance of the AC signal (e.g., RF signal).

With reference to <3004>, when the switch is on, the RF signal branched to the first signal line 320 and the second signal line 330 around the ground bridge 340 at the first point L1 may be transferred with symmetrical power at both sides (e.g., on both the first and second signal lines 320 and 33) around the ground bridge 340, thereby preventing a phenomenon (e.g., self-actuation, self-biasing) that the movable ground bridge 340 is shaken due to RF power.

When describing the switch-off operation, if a DC voltage (or bias voltage) greater than or equal to a configured value is applied to the ground bridge 340 and the first signal line 320, as illustrated in <3005> and <3006>, while the ground bridge 340 moves in a direction of the first signal line 320, the ground bridge 340 may contact the first signal line 320, and the RF signal may be shunted.

According to an embodiment, when a DC voltage is applied to the first signal line 320 and the ground bridge 340, a DC signal does not flow to the second signal line 330 by the first capacitor 350 and the second capacitor 355, and the ground bridge 340 is in contact with the first signal line 320 by an electric force between the first signal line 320 and the ground bridge 340, and the RF signal transferred through the first signal line 320 is guided to the ground; thus, the switch 300 may be turned off.

Figure 4A:
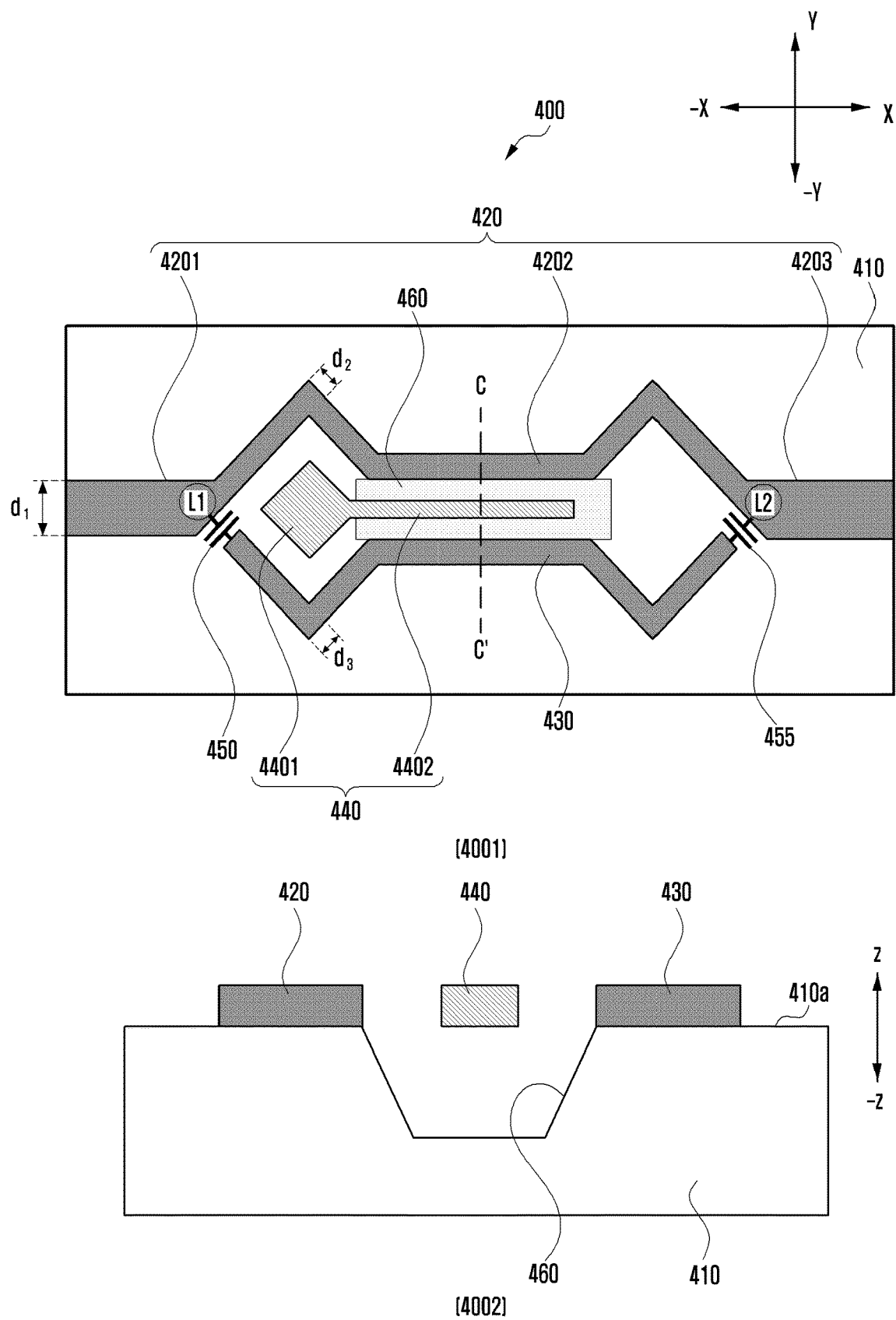
FIG. 4A illustrates a switch structure according to various embodiments.

FIG. 4A illustrates a switch structure according to various embodiments. Here, <4001> is a plan view illustrating a first surface (e.g., upper surface) of the switch, and <4002> is a cross-sectional view taken along line C-C' of 3001.

With reference to FIG. 4A, a switch 400 (e.g., radio frequency (RF) switch) according to another embodiment may be formed in a cantilever pattern in which one side of a ground bridge 440 is fixed to a substrate 410.

The ground bridge 440 of the cantilever pattern may turn on/off the switch with a lower driving voltage (e.g., bias voltage) than the ground bridge 340 of FIG. 3A in which both sides (e.g., the first fixing part 3420 and the second fixing part 3421) are fixed to the substrate 410.

According to an embodiment, the switch 400 may include a substrate 410, a first signal line 420, a second signal line 430, a ground bridge 440, a first capacitor 450, and a second capacitor 455.

According to an embodiment, the first signal line 420 may include a first area 4201 (e.g., input/output line) having a first width d1, a second area 4202 (e.g., signal branch line) extended from one direction (e.g., x-axis direction, direction ①) of the first area 4201 and having a second width d2 narrower than the first width d1, or a third area 4203 (e.g., input/output line) extended from the second area 4202 and having the first width d1. The second signal line 430 may be designed to have a third width d3. The third width d3 of the second signal line 430 may be designed to match the same impedance as that of the second width d2 of the first signal line 420 for branching the RF signal.

According to an embodiment, the first signal line 420 may be configured to couple to one end of the second signal line 430 so as to branch the RF signal at a first point L1, and to couple to the other end of the second signal line 430 at a second point L2. For example, the first capacitor 450 may be disposed between the first point L1 of the first signal line 420 and one end of the second signal line 430, and the second capacitor 455 may be disposed between the second point L2 of the first signal line 420 and the other end of the second signal line 430.

Because the first signal line 420, the second signal line 430, the first capacitor 450, and the second capacitor 455 other than the pattern of the ground bridge 440 provide substantially the same functions as the first signal line 320, the second signal line 30, the first capacitor 350, and the second capacitor 355 of FIG. 3A, a detailed description thereof will be omitted.

As illustrated in <4001>, the ground bridge 440 of a cantilever pattern may be disposed to be at least partially movable in a space between the first signal line 420 and the second signal line 430 disposed on the substrate 410. The ground bridge 440 may be disposed in the groove 360 formed on the substrate 410 in the first direction (e.g., x-axis direction).

As illustrated in <4002>, the substrate 410 may have a groove (or trench) 360 disposed in a third direction (e.g., -z direction) lower by a first depth than a first surface (e.g., upper surface) 410a. For example, the ground bridge 440 may be configured to elasticity move, and be made of a material having a restoring force (e.g., biased) when a DC voltage (e.g., bias voltage) is removed.

For example, the ground bridge 440 may include at least partially movable vibrating part (e.g., actuating part) 4402 and a fixing part (e.g., fixed pad, fixed part) 4401 extended in one direction from the vibrating part 4402 and for supporting the vibrating part 4402 on the substrate 410. The fixing part 4401 may serve to support the vibrating part 4402 disposed on the groove 460 and to transfer a voltage applied through a feeding line to the vibrating part 4402. Because the vibrating part 4402 is floating in the groove 460 formed in the substrate 410, when a DC voltage is applied, the vibrating part 4402 may move by electric force generated between the vibrating part 4402 and the first signal line 420.

Figure 4B:
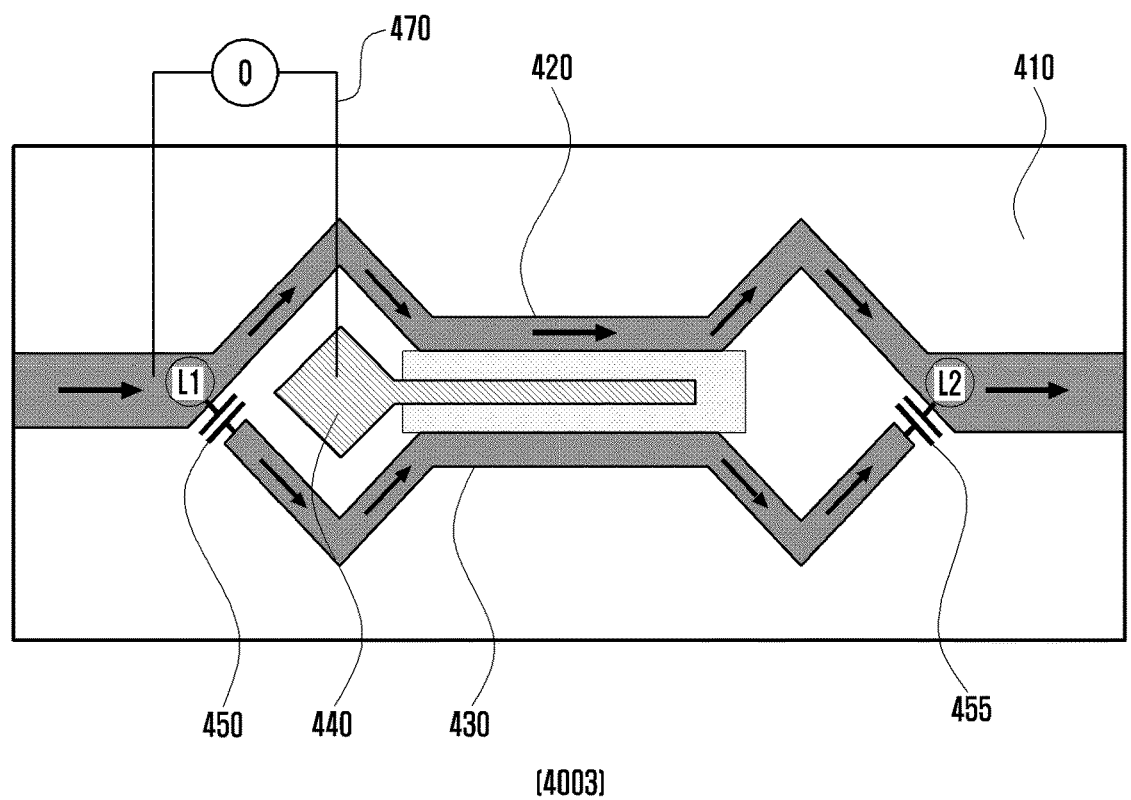
FIG. 4B is a diagram illustrating an on/off operation of an improved switch according to various embodiments.

FIG. 4B is a diagram illustrating an on/off operation of an improved switch according to various embodiments.

When describing an ON operation of the switch, if a DC voltage (or bias voltage) is not applied to the ground bridge 440 and the first signal line 420, the switch 400 (e.g., radio frequency (RF) switch) may be turned on to transfer the RF signal from one side to the other side.

The RF signal transferred through the RF input terminal (RF in) is branched at the first point L1, merged at the second point L2, and transferred to the RF output terminal. For example, as illustrated in <4003>, in case that the RF signal input to the first signal line 420 through the RF input terminal is transferred with first power, the RF signal may be transferred with second power from the first point L1 to each of the first signal line 420 and the second signal line 430. Because the first capacitor 450 and the second capacitor 455 shunt a DC signal, a transmission performance of the AC signal (e.g., RF signal) may be less affected.

When the switch is ON, the RF signal branched to the first signal line 420 and the second signal line 430 around the ground bridge 440 at the first point L1 is transferred with symmetrical power to both sides, thereby preventing a phenomenon (e.g., self-actuation, self-biasing) in which the movable ground bridge 440 is shaken due to RF power.

When describing an OFF operation of the switch, as illustrated in <4003>, if a DC voltage (or bias voltage) is applied to the ground bridge 440 and the first signal line 420, while the ground bridge 440 moves in a direction of the first signal line 420, the ground bridge 440 is in contact with the first signal line 420, and the RF signal may be shunted. When a DC voltage is applied, the DC signal does not flow to the second signal line 430 through the first capacitor 450 and the second capacitor 455, and the ground bridge 440 is in contact with the first signal line 420 by an electric force between the first signal line 420 and the ground bridge 440, and the RF signal transferred through the first signal line 420 is induced to the ground so that the RF switch 400 may be turned off.

Figure 4B:
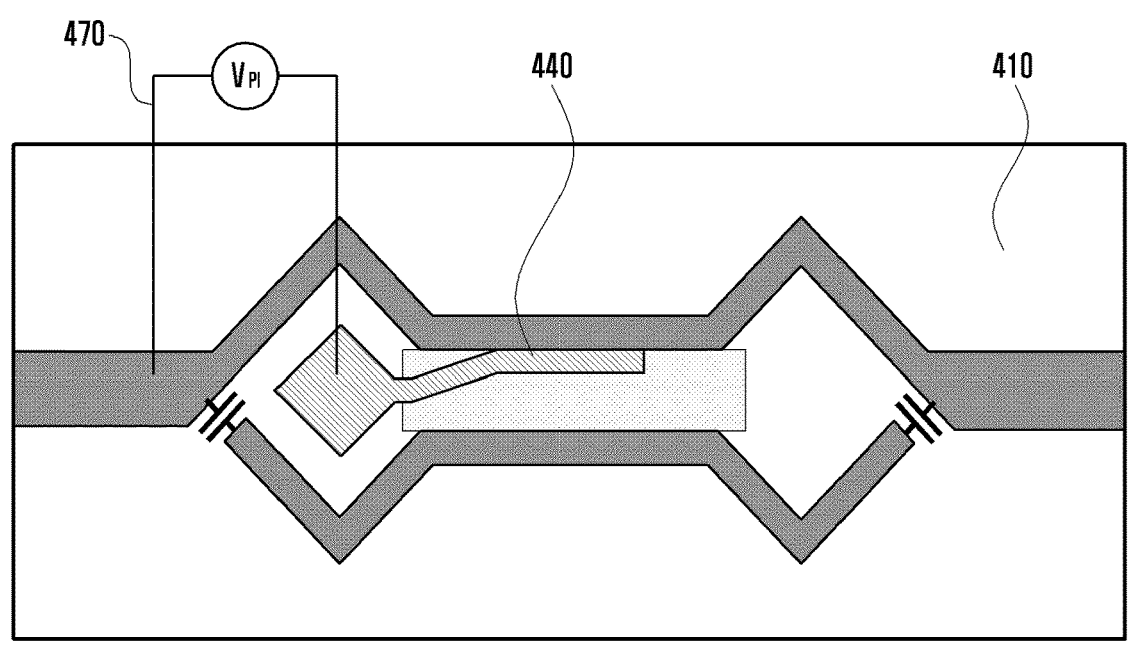

As described herein, one or more non-limiting embodiments of the present disclosure provides a switch (e.g., the switch 300 of FIG. 3, and the switch 400 of FIG. 4) included in an electronic device (e.g., the electronic device 101 of FIG. 1) according to various embodiments may include a substrate (e.g., the substrate 310 of FIG. 3, the substrate 410 of FIG. 4), a first signal line (e.g., the first signal line 320 of FIG. 3, the first signal line 420 of FIG. 4) disposed on the substrate in a first direction to be connected to an input terminal and an output terminal of a wireless communication signal, a second signal line (e.g., the second signal line 330 of FIG. 3, the second signal line 430 of FIG. 4) to be spaced apart from the first signal line in a first direction in parallel with the first signal line so as to branch the wireless communication signal at the first point L1 and the second point L2 of the first signal line on the substrate, a ground bridge (e.g., the ground bridge 340 of FIG. 3, the ground bridge 440 of FIG. 4) disposed to be at least partially movable in a space between the first signal line and the second signal line disposed on the substrate and connected to the ground, a first capacitor (e.g., the first capacitor 350 of FIG. 3, the first capacitor 450 of FIG. 4) formed between the first point of the first signal line and one end of the second signal line, and a second capacitor (e.g., the second capacitor 355 of FIG. 3 and the second capacitor 455 of FIG. 4) formed between the second point of the first signal line and the other end of the second signal line.

At least a portion of the ground bridge according to various embodiments may be disposed lower than an outer surface (e.g., an upper surface) of the substrate and to be moveable through a groove (e.g., the groove 360 of FIG. 3, the groove 460 of FIG. 4) having a predetermined length in the first direction, and the groove may be formed in an area of the substrate between the first signal line and the second signal line.

The wireless communication signal according to various embodiments may be a radio frequency signal of 500 MHz or more.

When a bias voltage is applied to the ground bridge and the first signal line, at least a portion of the ground bridge according to various embodiments may be in contact with at least a portion of the first signal line by a movement of the ground bridge in a direction of the first signal line to shunt the wireless communication signal transferred through the first signal line and the second signal line.

When a bias voltage is not applied to the ground bridge and the first signal line according to various embodiments, the wireless communication signal input through the input terminal of the first signal line may be branched to the second signal line at the first point L1 and be transferred to an output terminal through the first signal line and the second signal line, and at least a portion of the ground bridge may be fixed in a space between the first signal line and the second signal line.

The first signal line according to various embodiments may have a first length, the second signal line may have a second length shorter than the first length, and the second signal line may be disposed between the first point and the second point.

The first signal line according to various embodiments may include a first area implemented with a first width, a second area extended from the first area and implemented with a second width narrower than the first width, and a third area extended from the second area and implemented with the second width, and the width of the second signal line may be disposed with a width matched with the same impedance as that of the second area of the first signal line.

The ground bridge is disposed in a space between the first signal line and the second signal line according to various embodiments and may be spaced apart by the same distance with respect to the first signal line and the second signal line.

The ground bridge according to various embodiments may include a vibrating part positioned movably in an area in which the groove is disposed, and first and second fixing parts which extended from both directions of the vibrating part and are electrically connected to the ground.

The ground bridge according to various embodiments may include a vibrating part positioned movably in an area in which the groove is disposed, and a fixing part extended in one direction of the vibrating part and fixed on the substrate.

The ground bridge according to various embodiments may include a conductive material having elasticity so as to be moveable on a substrate in which the groove is formed.

Figure 5:
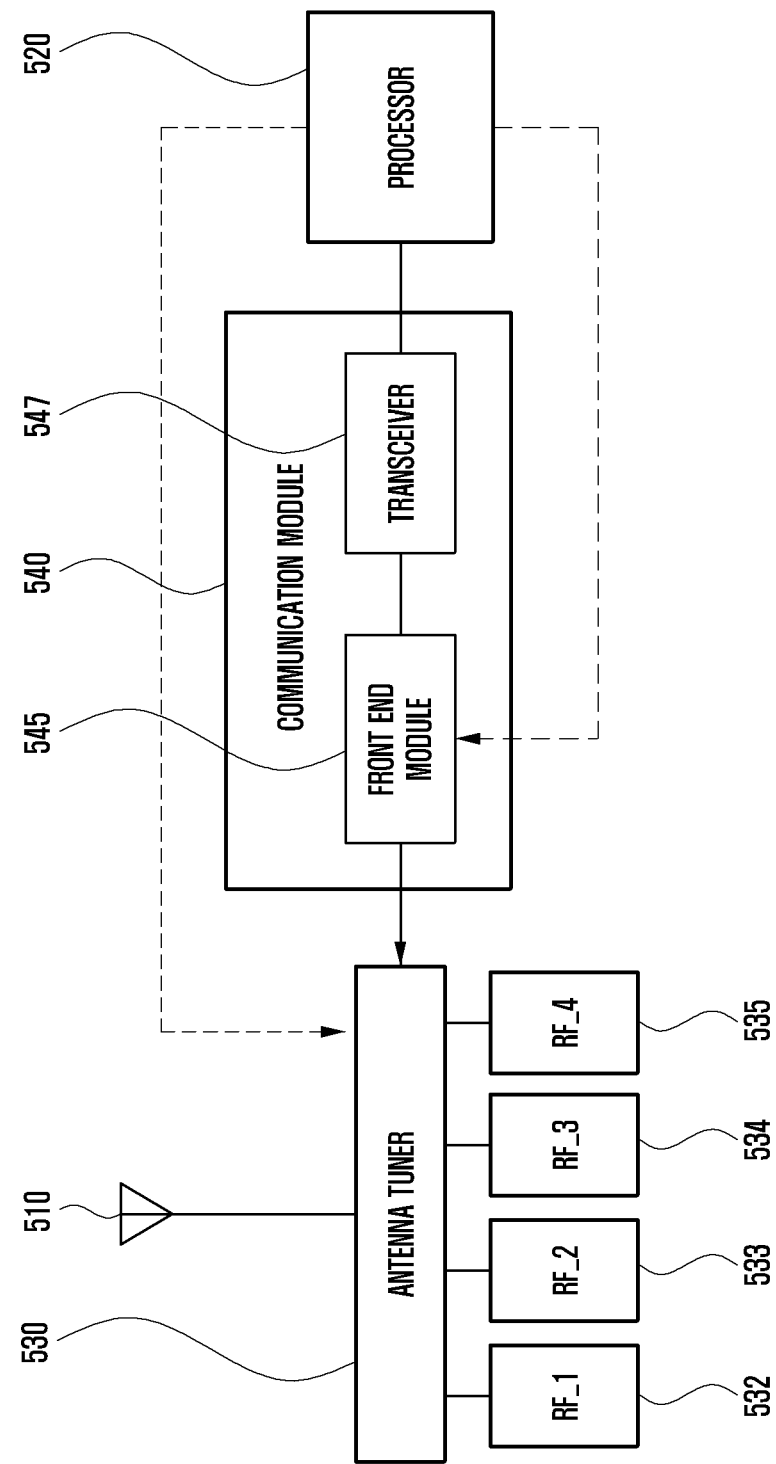
FIG. 5 illustrates a configuration of an electronic device including a switch according to various embodiments.

FIG. 5 illustrates a configuration of an electronic device including a switch according to various embodiments.

With reference to FIG. 5, at least one switch (e.g., the switches 300 and 400 of FIGS. 3A and 4A) according to various embodiments may be included in an antenna tuner (or antenna matching unit) 530 of an electronic device (e.g., the electronic device 101 of FIG. 1).

For example, the electronic device 101 may include an antenna 510, a processor 520, an antenna tuner 530, and a communication module 540.

The antenna 510 may transmit and receive a signal of a designated frequency band. The antenna 510 may include at least one antenna element. A size and shape of the antenna element may be implemented differently according to a resonant frequency. According to an embodiment, the antenna 510 may be formed with an antenna array including a plurality of antenna elements.

The antenna tuner 530 may be disposed between the antenna 510 and a front end module 545 of the communication module 540. The antenna 510 may be connected to the communication module 540 through the antenna tuner 530.

The antenna tuner 530 may perform impedance matching of a radio signal transmitted to the antenna 510. In an embodiment, the antenna tuner 530 may include a plurality of switches, and a plurality of RF output terminals (e.g., RF1, 532, RF2, 533, RG 3, 534, and RF 4, 535) connected to the antenna. For example, the antenna tuner 530 may include at least one switch of the structure illustrated in FIG. 3A or 4A. A detailed description of the antenna tuner 530 will be described with reference to FIG. 6.

The antenna tuner 530 may change an RF signal path through an ON/OFF operation of switches included in the antenna tuner 530 under the control of the processor 520.

The communication module 540 may process a radio signal (e.g., RF signal) received through the antenna 510 and transfer the radio signal to the processor 520, and process the signal transferred from the processor 520 to transfer the signal to the antenna 510. According to an embodiment, the communication module 540 may include a radio frequency integrated circuit (RFIC), and further include the configuration of the communication module of FIG. 1.

For example, the communication module 540 may further include a front-end module 545 and/or a transceiver 547.

The transceiver 547 may transfer the radio signal to the antenna 510 through the front-end module 545 in the form of an electromagnetic wave including a carrier wave, and convert the radio signal received from the antenna 510 to a digital signal that may be processed in the processor 520, and transfer the digital signal to the processor 520.

The transceiver 547 may include an oscillator for generating a carrier wave, a modulation circuit (not illustrated) for modulating a carrier wave, and a demodulation circuit (not illustrated) for demodulating a radio signal received from the antenna 510.

The front-end module 545 may amplify a signal transferred from the transceiver 547 and transfer the signal to the antenna 510, amplify the signal received from the antenna 510, and transfer the amplified signal to the transceiver 547. For example, the front-end module 545 may include a power amplifier (not illustrated), a low-noise amplifier (LNA) (not illustrated), and/or a filter (not illustrated).

The processor 520 may control the overall operation of the electronic device 101 and the signal flow between components (e.g., the antenna 510, the antenna tuner 530, and the communication module 540) of the electronic device and perform data processing. The processor 520 may include a central processer (CPU), an application processor (AP), and/or a communication processor (CP). The processor 520 may include a single core processor or a multi-core processor.

According to an embodiment, the processor 520 may determine a phase and frequency of a wireless signal according to an antenna use environment, and control the communication module 540 to generate a wireless communication band (e.g., baseband) signal. The processor 520 may control the communication module 540 to process a wireless signal received through the antenna.

According to an embodiment, the processor 520 may control the antenna tuner 530 to perform impedance matching of a radio signal and adjust a phase of the antenna 510 for impedance compensation. The processor 520 may change an RF signal path through ON/OFF operations of switches included in the antenna tuner 530.

The electronic device 101 according to an embodiment includes at least one switch (e.g., RF switch) of the structure illustrated in FIG. 3A or 4A in the antenna tuner 530; thus, even when a high voltage is applied to the signal line that transmits the RF signal, the switch on/off is controlled through a mechanical movement of the ground bridge horizontally moving and formed on the substrate, and an internal self-actuation phenomenon and self-biasing phenomenon may be suppressed by RF signal lines branched to both sides of the ground bridge.

Figure 6:
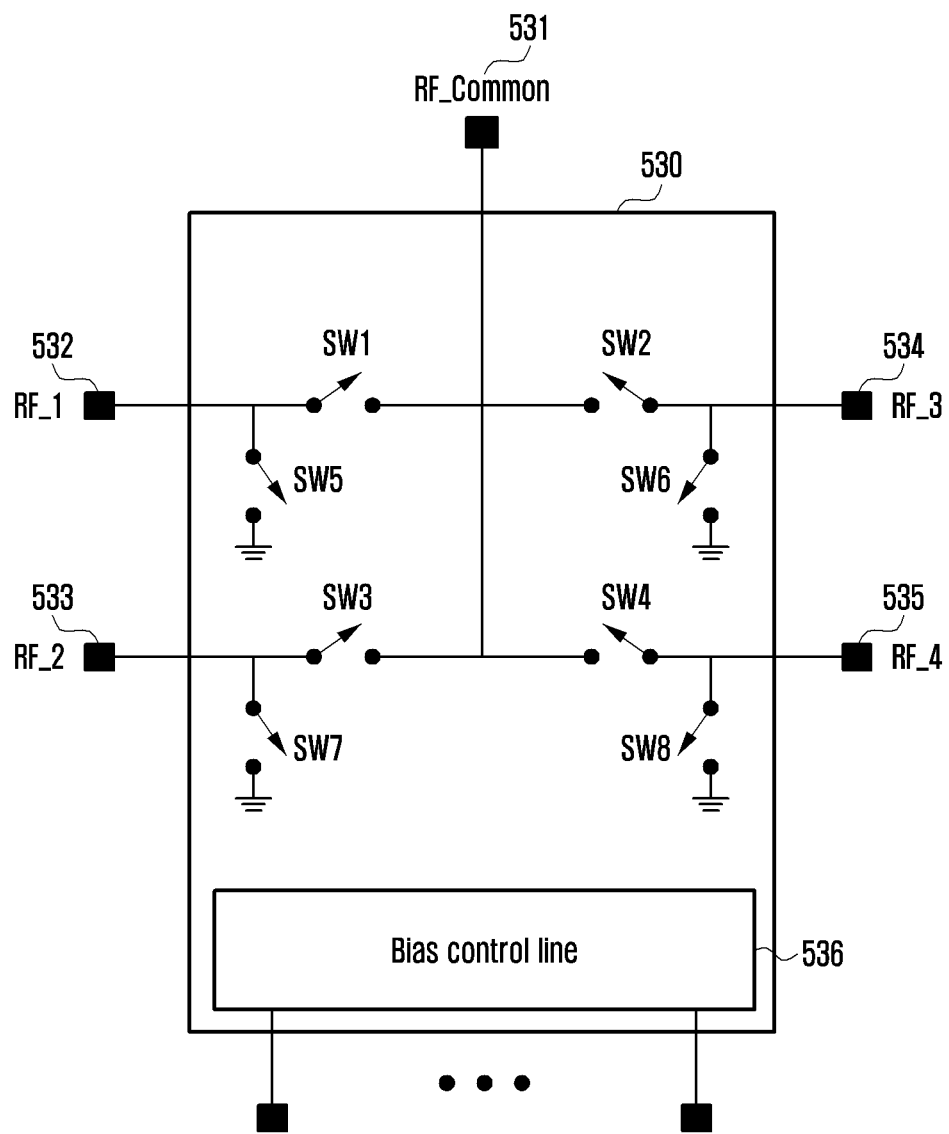
FIG. 6 illustrates a circuit configuration of an antenna tuner according to various embodiments.

FIG. 6 illustrates a circuit configuration of an antenna tuner according to various embodiments.

With reference to FIG. 6, an antenna tuner (e.g., an antenna tuner 620 of FIG. 6) according to an embodiment may perform impedance matching using a single pole n-throw (SPnT) switch.

For example, the antenna tuner 530 illustrated in FIG. 5 may be implemented into a single pole 4-throw (SP4T) switch. For example, the SPnT switch may include one common port 531 and four output ports (e.g., RF1 532, RF2 533, RF3 534, and RF4 535).

According to an embodiment, the SPnT switch may include switches SW1, SW2, SW3, and SW4 connected to the common port 531 and switches SW5, SW6, SW7, and SW8 disposed between RF output ports RF_1, RF_2, RF_3, RF_4 and RF signal switches SW1, SW2, SW3, and SW4.

The processor 520 of the electronic device 101 may control ON/OFF of the switches SW5, SW6, SW7, and SW8 through a bias control line 536 to selectively output an RF signal applied to the RF common port 531 to at least one selected RF output port of the RF output ports RF1 532, RF2 533, RF3 534, or RF 4 535.

For example, the processor 520 may control an RF signal applied through a common port 531 to be output to a first output port (RF_1) 532 through a first switch (e.g., SW1). In case that the processor 520 turns off a fifth switch SW5 through a bias control line 536 to shunt a bias voltage applied to the first switch SW1, the first switch SW1 may turn on to control to form an electrical path between the common port 531 and the first output port (RF_1) 532. In this case, the processor 520 applies a bias voltage to a second switch SW2, a third switch SW3, or a fourth switch SW4 to turn off the second switch SW2, the third switch SW3, or the second switch SW4, thereby shunting the RF signal transferred to the second output port (RF_2) 533, the third output port (RF_3) 534, and the fourth output port (RF_4) 535.

Various embodiments include a switch of a proposed structure, so that an RF signal is branched and transferred in parallel with a moving structure (e.g., ground bridge) in both directions, thereby suppressing internal self-shaking; thus, it is possible to implement an antenna tuner useful for high voltage and high power without affecting the change in radiation characteristics of the antenna.

Figure 7:
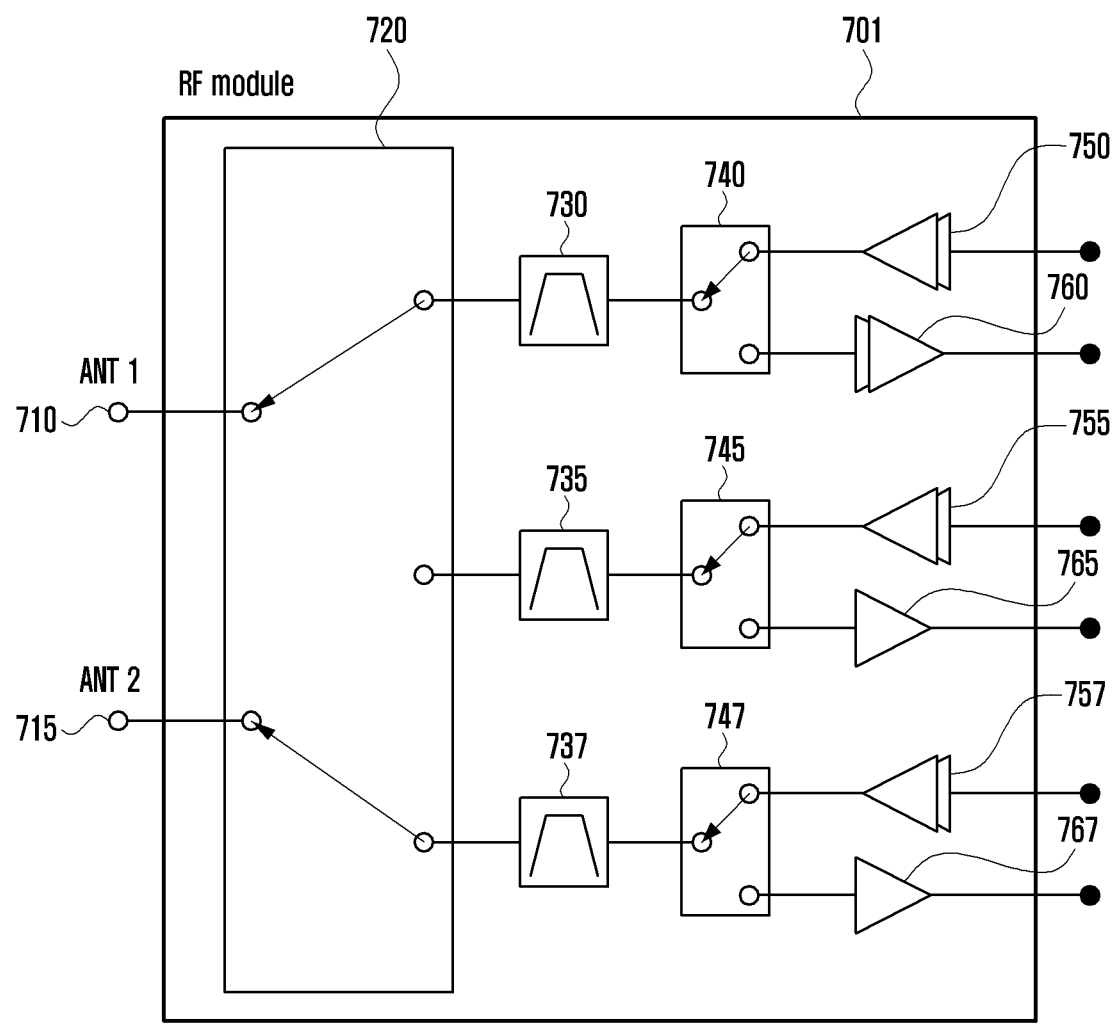
FIG. 7 illustrates a configuration of an RF module including a switch according to various embodiments.

FIG. 7 illustrates a configuration of an RF module including a switch according to various embodiments.

With reference to FIG. 7, at least one switch (e.g., switches 300 and 400 illustrated in FIGS. 3A and 4A) according to various embodiments may be included in an RF module (or front-end module) 701 of the electronic device 101.

According to an embodiment, the RF module 701 may support a two-uplink carrier aggregation (CA) scheme using a first antenna 710 and a second antenna 715. For example, the RF module 701 may include an antenna switch 720, a plurality of band filters 730, 735, and 737, a plurality of transmission and reception switches 740, 745, and 747, a plurality of power amplifiers (PAs) 750, 755, and 757 and/or a plurality of low noise amplifiers (LANs) 760, 765, and 767.

According to an embodiment, the antenna switch 720 may be connected to the first antenna 710 and the second antenna 715, and be connected to the plurality of band filters 730, 735, and 737. The first band filter 730 may be connected to the first transmission and reception switch 740, the second band filter 735 may be connected to the second transmission and reception switch 745, and the third band filter 737 may be connected to the third transmission and reception switch 747.

According to an embodiment, the first transmission and reception switch 740 may be connected to the first PA 750 and the first LAN 760, the second transmission and reception switch 745 may be connected to the second PA 755 and the second LAN 765, and the third transmission and reception switch 747 may be connected to the third PA 757 and the third LAN 767.

According to an embodiment, the processor 520 of the electronic device 101 may establish an RF reception path or an RF transmission and reception path, and selectively control a connection of the switches 720, 740, 745, and 747 according to the RF reception path or the RF transmission and reception path. The switches 720, 740, 745, and 747 may be switches for switching whether to connect to an RF signal path.

For example, in order to support two-uplinks, the processor 520 may control the first transmission and reception switch 740 and the antenna switch 720 to transfer a first RF signal amplified through the first PA 750 to the antenna 710, and control the third transmission and reception switch 747 and the antenna switch 720 to transfer a second RF signal amplified through the third PA 757 to the second antenna 715.

According to various embodiments, when a design for preventing mutual interference and distortion between two input signals (e.g., first RF signal and second RF signal) is required to support two-uplinks, by utilizing a switch (e.g., radio frequency (RF) switch) of a proposed structure in an RF module, it is possible to support two-uplinks with high power and no mutual interference.

As described herein, various non-limiting embodiments of the present disclosure provide an electronic device according to various embodiments may include a communication module including at least one switch; and a processor, wherein the processor may be configured to control on/off of a wireless communication signal and a bias voltage through the at least one switch, the at least one switch may include a substrate, a first signal line disposed in a first direction to be connected to an input terminal and an output terminal of the wireless communication signal on the substrate, a second signal line to be spaced apart from the first signal line in a first direction in parallel with the first signal line so as to branch the wireless communication signal at a first point L1 and a second point L2 of the first signal line on the substrate, a ground bridge disposed to be at least partially movable in a space between the first signal line and the second signal line disposed on the substrate and connected to a ground, a first capacitor formed between a first point of the first signal line and one end of the second signal line, and a second capacitor formed between a second point of the first signal line and the other end of the second signal line.

An electronic device (e.g., the electronic device 101 of FIG. 1) according to various embodiments may include a communication module (e.g., the communication module 540 of FIG. 5) including at least one switch (e.g., the switch 300 of FIG. 3 and the switch 400 of FIG. 4); and a processor (e.g., the processor 520 of FIG. 5), wherein the processor may be configured to control on/off of a wireless communication signal and a bias voltage through the at least one switch, wherein the at least one switch may include a substrate (e.g., the substrate 310 of FIG. 3, the substrate 410 of FIG. 4); a first signal line (e.g., the first signal line 320 of FIG. 3 and the first signal line 420 of FIG. 4) disposed on the substrate in a first direction to be connected to an input terminal and an output terminal of the wireless communication signal; a second signal line (e.g., the second signal line 330 of FIG. 3, the second signal line 430 of FIG. 4) disposed on the substrate to be spaced apart from the first signal line in a first direction in parallel with the first signal line so as to branch the wireless communication signal at a first point L1 and a second point L2 of the first signal line; a ground bridge (e.g., the ground bridge 340 of FIG. 3, the ground bridge 440 of FIG. 4) disposed to be at least partially movable in a space between the first signal line and the second signal line disposed on the substrate and connected to a ground; a first capacitor (e.g., the first capacitor 350 of FIG. 3, the first capacitor 450 of FIG. 4) formed between a first point of the first signal line and one end of the second signal line; and a second capacitor (e.g., the second capacitor 355 of FIG. 3, the second capacitor 455 of FIG. 4) formed between a second point of the first signal line and the other end of the second signal line.

In the electronic device according to various embodiments, at least a portion of the ground bridge may be disposed lower than an outer surface (e.g., an upper surface) of the substrate and be movably disposed through a groove (e.g., the groove 360 of FIG. 3, the groove 460 of FIG. 4) having a predetermined length in a first direction, and the groove may be formed in an area of the substrate between the first signal line and the second signal line.

According to various embodiments, the wireless communication signal may include a radio frequency signal of 500 MHz or more, and the at least one switch may be included in an antenna tuner or a radio frequency (RF) front-end module of the electronic device.

According to various embodiments, the processor may control to apply a bias voltage to the ground bridge and the first signal line so that the ground bridge is in contact with at least a portion of the first signal line by a movement of the ground bridge in a direction of the first signal line to shunt the wireless communication signal transferred through the first signal line and the second signal line.

According to various embodiments, the processor may control to shunt a bias voltage applied to the ground bridge and the first signal line to transfer a wireless communication signal input through an input terminal of the first signal line to transfer to the output terminal through the first signal line and the second signal line.

According to various embodiments, the first signal line may include a first area implemented with a first width, a second area extended from the first area and implemented with a second width narrower than the first width, and a third area extended from the second area and implemented with the second width, and the second signal line may be disposed with a width matched with the same impedance as that of the second area of the first signal line.

According to various embodiments, the ground bridge disposed in a space between the first signal line and the second signal line may be disposed to be spaced apart from each other at the same distance with respect to each of the first signal line and the second signal line.

According to various embodiments, the ground bridge may include a vibrating part positioned movably in an area in which the groove is disposed, and first and second fixing parts extended from both directions of the vibrating part and disposed on the substrate.

According to various embodiments, the ground bridge may include a vibrating part positioned movably in an area in which the groove is disposed, and a fixing part extended in one direction of the vibrating part and fixed on the substrate.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device #01) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. A switch included in an electronic device, the switch comprising:
   a substrate;
   a first signal line disposed on the substrate in a first direction;
   a second signal line disposed on the substrate to be spaced apart from the first signal line in the first direction and in parallel with the first signal line so as to branch a wireless communication signal at a first point (L1) and a second point (L2) of the first signal line;
   a ground bridge disposed to be at least partially movable in a space between the first signal line and the second signal line disposed on the substrate and connected to a ground;
   a first capacitor formed between the first point of the first signal line and one end of the second signal line; and
   a second capacitor formed between the second point of the first signal line and the other end of the second signal line.

2. The switch of claim 1, wherein at least a portion of the ground bridge is movably disposed through a groove having a predetermined length in the first direction and extending into the substrate, and the groove is formed in an area of the substrate between the first signal line and the second signal line and is lower than an outer surface of the substrate.

3. The switch of claim 1, wherein the wireless communication signal is a radio frequency signal of 500 MHz or more.

4. The switch of claim 2, wherein at least a first portion of the ground bridge is in contact with at least a portion of the first signal line by a movement of the ground bridge in a direction of the first signal line when a bias voltage is applied to the ground bridge and the first signal line to shunt the wireless communication signal transferred through the first signal line and the second signal line.

5. The switch of claim 2, wherein, when a bias voltage is not applied to the ground bridge and the first signal line, the wireless communication signal input through an input terminal of the first signal line is branched to the second signal line at the first point to be transferred to an output terminal through the first signal line and the second signal line, and at least a second portion of the ground bridge is fixed in a space between the first signal line and the second signal line.

6. The switch of claim 1, wherein the first signal line has a first length, and the second signal line has a second length shorter than the first length and is disposed between the first point and the second point.

7. The switch of claim 1, wherein the first signal line comprises a first area implemented with a first width, a second area extended from the first area and implemented with a second width narrower than the first width, and a third area extended from the second area and implemented with the second width, and the second signal line is disposed with a width matched with the same impedance as that of the second area of the first signal line.

8. The switch of claim 1, wherein the ground bridge disposed in a space between the first signal line and the second signal line is disposed to be spaced apart by the same distance from each of the first signal line and the second signal line.

9. The switch of claim 2, wherein the ground bridge comprises a vibrating part positioned movably in an area in which the groove is disposed, and first and second fixing parts extended from both directions of the vibrating part to be electrically connected to the ground.

10. The switch of claim 2, wherein the ground bridge comprises a vibrating part positioned movably in an area in which the groove is disposed, and a fixing part extended in one direction of the vibrating part and fixed on the substrate.

11. The switch of claim 2, wherein the ground bridge comprises a conductive material having elasticity so as to be moveable on the substrate in which the groove is formed.

12. An electronic device, comprising:
a communication module comprising at least one switch; and
a processor,
wherein the processor is configured to control on/off of a wireless communication signal and a bias voltage through the at least one switch, and
wherein the at least one switch comprises:
a substrate, a first signal line disposed on the substrate in a first direction, a second signal line disposed on the substrate to be spaced apart from the first signal line in the first direction and in parallel with the first signal line so as to branch the wireless communication signal at a first point (L1) and a second point (L2) of the first signal line, a ground bridge disposed to be at least partially movable in a space between the first signal line and the second signal line disposed on the substrate and connected to a ground, a first capacitor formed between the first point of the first signal line and one end of the second signal line, and a second capacitor formed between the second point of the first signal line and the other end of the second signal line.

13. The electronic device of claim 12, wherein at least a portion of the ground bridge is movably disposed through a groove having a predetermined length in the first direction and extending into the substrate such that it is lower than an outer surface of the substrate, and the groove is disposed between the substrate on which the first signal line and the second signal line are disposed.

14. The electronic device of claim 12, wherein the wireless communication signal comprises a radio frequency signal of 500 MHz or more, and the at least one switch is included in at least one of an antenna tuner or a radio frequency (RF) front-end module of the electronic device.

15. The electronic device of claim 12, wherein the processor is configured to apply a bias voltage to the ground bridge and the first signal line so that the ground bridge is in contact with at least a portion of the first signal line by a movement of the ground bridge in a direction of the first signal line to shunt the wireless communication signal transferred through the first signal line and the second signal line.

16. The electronic device of claim 12, wherein the processor is configured to control to shunt a bias voltage applied to the ground bridge and the first signal line to transfer the wireless communication signal input through an input terminal of the first signal line to an output terminal through the first signal line and the second signal line.

17. The electronic device of claim 12, wherein the first signal line comprises a first area implemented with a first width, a second area extended from the first area and implemented with a second width narrower than the first width, and a third area extended from the second area and implemented with the second width, and the second signal line is disposed with a width matched with the same impedance as that of the second area of the first signal line.

18. The electronic device of claim 12, wherein the ground bridge disposed in a space between the first signal line and the second signal line is disposed to be spaced apart by the same distance from each of the first signal line and the second signal line.

19. The electronic device of claim 13, wherein the ground bridge comprises a vibrating part positioned movably in an area in which the groove is disposed, and first and second fixing parts extended from both directions of the vibrating part and disposed on the substrate.

20. The electronic device of claim 13, wherein the ground bridge comprises a vibrating part positioned movably in an area in which the groove is disposed and a fixing part extended in one direction of the vibrating part and fixed on the substrate.

\* \* \* \* \*